United States Patent
Horng et al.

(10) Patent No.: US 8,378,330 B2
(45) Date of Patent: Feb. 19, 2013

(54) CAPPING LAYER FOR A MAGNETIC TUNNEL JUNCTION DEVICE TO ENHANCE DR/R AND A METHOD OF MAKING THE SAME

(75) Inventors: Cheng T. Horng, San Jose, CA (US); Ru-Ying Tong, Los Gatos, CA (US)

(73) Assignee: Headway Technologies, Inc., Milpitas, CA (US)

(*) Notice: Subject to any disclaimer, the term of this patent is extended or adjusted under 35 U.S.C. 154(b) by 272 days.

(21) Appl. No.: 12/584,190

(22) Filed: Sep. 1, 2009

(65) Prior Publication Data

US 2009/0325319 A1    Dec. 31, 2009

Related U.S. Application Data

(62) Division of application No. 11/496,691, filed on Jul. 31, 2006, now Pat. No. 7,595,520.

(51) Int. Cl.
*H01L 43/00* (2006.01)

(52) U.S. Cl. ............. 257/2; 257/3; 257/4; 257/5; 257/9; 257/E43.004; 257/E43.005

(58) Field of Classification Search .................. 257/2–6, 257/9, E43.005–E43.006
See application file for complete search history.

(56) References Cited

U.S. PATENT DOCUMENTS

| | | | |
|---|---|---|---|
| 6,574,079 B2 | 6/2003 | Sun et al. | |
| 6,686,071 B2 | 2/2004 | Sakakima et al. | |
| 6,893,714 B2 | 5/2005 | Moriwaki et al. | |
| 6,903,909 B2 | 6/2005 | Sharma et al. | |
| 7,072,208 B2 | 7/2006 | Min et al. | |
| 7,218,485 B2 | 5/2007 | Hasegawa et al. | |
| 7,241,514 B2 | 7/2007 | Kagami et al. | |
| 7,379,280 B2 | 5/2008 | Fukumoto et al. | |
| 7,405,011 B2 | 7/2008 | Stipe et al. | |
| 2005/0254293 A1 | 11/2005 | Horng et al. | |
| 2005/0271799 A1 | 12/2005 | Moriwaki et al. | |
| 2005/0276099 A1 | 12/2005 | Horng et al. | |
| 2006/0114716 A1 | 6/2006 | Kai et al. | |
| 2007/0014149 A1 | 1/2007 | Nagamine et al. | |

(Continued)

FOREIGN PATENT DOCUMENTS

| | | |
|---|---|---|
| JP | 09-326104 | 12/1997 |
| JP | 2001-352112 | 12/2001 |

(Continued)

OTHER PUBLICATIONS

EP 07 39 2004 European Search Report, Nov. 23, 2007, European Patent Office.

(Continued)

*Primary Examiner* — Minchul Yang
(74) *Attorney, Agent, or Firm* — Saile Ackerman LLC; Stephen B. Ackerman

(57) ABSTRACT

An MTJ in an MRAM array or TMR read head is disclosed in which a low magnetization capping layer is a composite having a NiFeHf inner layer formed on a NiFe or CoFeB/NiFe free layer, a Ta middle layer, and a Ru outer layer on the Ta layer. For example, a low magnetization NiFeHf layer is achieved by co-sputtering NiFe and Hf targets with a forward power of 400 W and 200 W, respectively. A higher Hf content increases the oxygen gettering power of the NiFeHf layer and the thickness is modified to change dR/R, RA, and magnetostriction values. A so-called dead layer between the free layer and capping layer is restored by incorporating a NiFeHf layer on the free layer to improve lattice matching. The Fe content in the NiFe target used to make the NiFeHf layer is preferably the same as in the NiFe free layer.

12 Claims, 2 Drawing Sheets

U.S. PATENT DOCUMENTS

| | | | |
|---|---|---|---|
| 2007/0148786 A1 | 6/2007 | Horng et al. | |
| 2007/0243638 A1 | 10/2007 | Horng et al. | |

FOREIGN PATENT DOCUMENTS

| | | |
|---|---|---|
| JP | 2003-198003 | 7/2003 |
| JP | 2003318462 | 11/2003 |
| JP | 2005-032780 | 2/2005 |
| JP | 2005-203701 | 7/2005 |
| JP | 2006-005356 | 1/2006 |
| JP | 2006-156957 | 6/2006 |
| JP | 2006-190838 | 7/2006 |
| JP | 2007-005555 | 1/2007 |

OTHER PUBLICATIONS

"MgO-Based Tunnel Junction Material for High-Speed Toggle Magnetic Random Access Memory," by Renu W. Dave et al., IEEE Transactions on Magnetics, vol. 42, No. 8, Aug. 2006, pp. 1935-1939.

"Conceptual material design for magnetic tunneling junction cap layer for high magnetoresistance ratio," by M. Nagamine et al., Journal of Applied Physice 99 08K703 (2006), American Institute of Physics, pp. 1-3.

"Oxygen as a surfactant in the growth of giant magnetoresistance spin valves," by W. F. Egelhoff, Jr. et al., Journal of Applied Physics, vol. 82, No. 12, Dec. 15, 1997, pp. 6142-6151.

"TMR Device with World Best Performance Fabricated by Mass Manufacturing System," Advanced Industrial Science and Technology (AIST), found: http://www.aist.go.jp/aist_e/latest_research/2004/20040907/20040907. html, on Jul. 27, 2006.

"Ternary NiFeX as soft biasing film in a magnetoresistive sensor," by Mao-Min Chen et al., Journal of Applied Physics, vol. 69, No. 8, Apr. 15, 1994, pp. 5631-5633.

"Increased Gilbert damping in spin valves and magnetic tunnel junctions," by Liesbet Lagae et al., Journal of Magnetism and Magnetic Materials 286 (2005), 291-296, 2004 Elsevier B.V..

Japanese Office Action Patent Application No. 2007-199432 Mail Date—May 8, 2012.

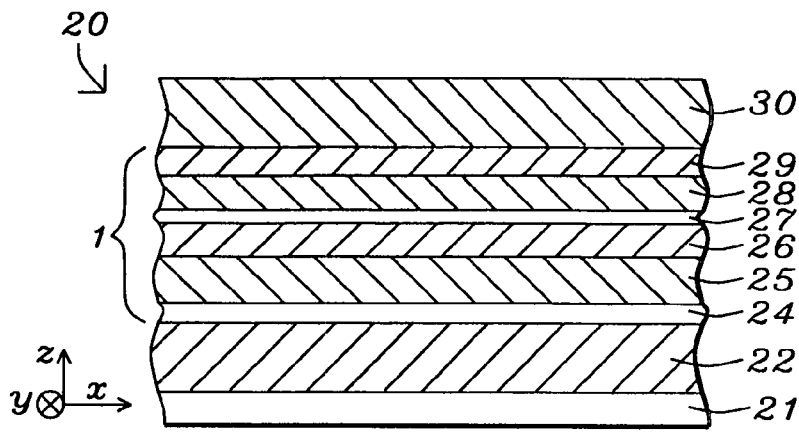
FIG. 1 - Prior Art
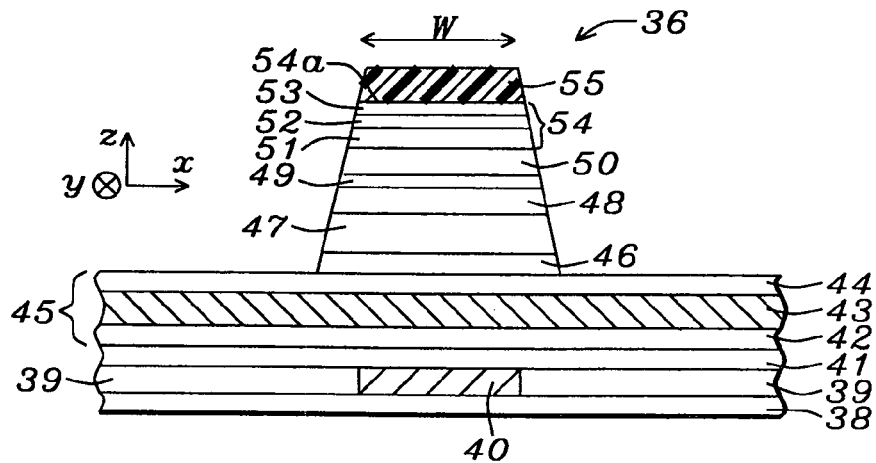
FIG. 2
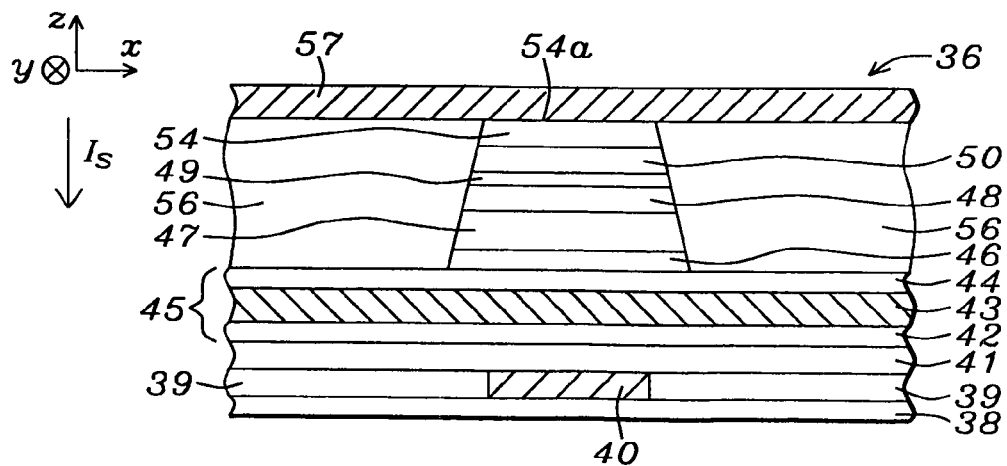
FIG. 3

CAPPING LAYER FOR A MAGNETIC TUNNEL JUNCTION DEVICE TO ENHANCE DR/R AND A METHOD OF MAKING THE SAME

This is a Divisional application of U.S. patent application Ser. No. 11/496,691, filed on Jul. 31, 2006, now U.S. Pat. No. 7,595,520 which is herein incorporated by reference in its entirety, and assigned to a common assignee.

RELATED PATENT APPLICATIONS

This application is related to the following: Ser. No. 10/868,715, filing date Jun. 15, 2004; and Ser. No. 10/844, 171, filing date May 12, 2004. This application is also related to the following: Ser. No. 11/404,446, filing date Apr. 14, 2006, and Ser. No. 11/317,388, filing date Dec. 22, 2005 assigned to a common assignee.

FIELD OF THE INVENTION

The invention relates to a high performance Magnetic Tunneling Junction (MTJ) element and a method for making the same, and more particularly, to a capping layer comprised of a low magnetization NiFeHf layer formed adjacent to the free layer that serves as an oxygen getter agent and minimizes the "dead layer" between a free layer and capping layer.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, Flash, etc. A MRAM device is generally comprised of an array of parallel first conductive lines on a horizontal plane, an array of parallel second conductive lines on a second horizontal plane spaced above and formed in a direction perpendicular to the first conductive lines, and an MTJ element interposed between a first conductive line and a second conductive line at each crossover location. A first conductive line may be a word line while a second conductive line is a bit line or vice versa. Alternatively, a first conductive line may be a bottom electrode that is a sectioned line while a second conductive line is a bit line (or word line). There are typically other devices including transistors and diodes below the array of first conductive lines as well as peripheral circuits used to select certain MRAM cells within the MRAM array for read or write operations.

An MTJ element may be based on a tunneling magneto-resistance (TMR) effect wherein a stack of layers has a configuration in which two ferromagnetic layers are separated by a thin non-magnetic dielectric layer. In an MRAM device, the MTJ element is formed between a bottom electrode such as a first conductive line and a top electrode which is a second conductive line. An MTJ stack of layers that are subsequently patterned to form an MTJ element may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer. The AFM layer holds the magnetic moment of the pinned layer in a fixed direction. In a MRAM MTJ, the free layer is preferably made of NiFe because of its reproducible and reliable switching characteristics as demonstrated by a low switching field (Hc) and switching field uniformity (σHc). Alternatively, an MTJ stack may have a top spin valve configuration in which a free layer is formed on a seed layer followed by sequentially forming a tunnel barrier layer, a pinned layer, AFM layer, and a capping layer.

The pinned layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

In a read operation, the information stored in an MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. In certain MRAM architectures, the top electrode or the bottom electrode participates in both read and write operations.

A high performance MTJ element is characterized by a high magnetoresistive (MR) ratio which is dR/R where R is the minimum resistance of the MTJ element and dR is the change in resistance observed by changing the magnetic state of the free layer. A high MR ratio of over 30% and a low magnetostriction ($\lambda_S$) value of about 1×10E-06 or less are desirable. This result is accomplished by (a) well controlled magnetization and switching of the free layer, (b) well controlled magnetization of a pinned layer that has a large exchange field and high thermal stability and, (c) integrity of the tunnel barrier layer. In order to achieve good barrier properties such as a specific junction resistance x area (RA) value and a high breakdown voltage (Vb), it is necessary to have a uniform tunnel barrier layer which is free of pinholes that is promoted by a smooth and densely packed growth in the AFM and pinned layers. Although a high RA value of about 10000 ohm-µm$^2$ is acceptable for a large area (A), RA should be relatively small (<1000 ohm-µm$^2$) for smaller areas. Otherwise, R would be too high to match the resistivity of the transistor which is connected to the MTJ.

In addition to MRAM applications, an MTJ element with a thinner tunnel barrier layer to give a very low RA (<5 ohms-µm$^2$) may be employed in TMR sensor head applications. Referring to FIG. 1, a portion of a TMR read head 20 on a substrate 21 is shown from the plane of an air bearing surface (ABS). There is an MTJ element 23 formed between a bottom lead 22 which is a bottom shield (S1) and a top lead 30 which is an upper shield (S2). The MTJ element 23 is comprised of a seed layer 24, an AFM layer 25, a pinned layer 26, a tunnel barrier layer 27, a free layer 28, and a cap layer 29 which are sequentially formed on the bottom lead 22 and have a composition and function similar to the corresponding layers in the MTJ element described previously. The free layer 28 may be a composite CoFe/NiFe layer. In this example, a NiFe layer in the bottom lead 22 represents S1 and a NiFe layer in the top lead 30 represents S2. A read operation involves moving the read head along the ABS in the z direction over a recording medium which causes an external magnetic field to influence the magnetization direction of the free layer.

Generally, the purpose of the capping layer is to protect underlying layers in the MTJ during etching and other process steps and to function as an electrical contact to an overlying conductive line. The typical capping layer for an MTJ stack is a non-magnetic conductive metal such as Ta or TaN. According to M. Nagamine et. al in "Conceptual material design for MTJ cap layer for high MR ratio" in abstract ED-10, 50$^{th}$ MMM conference, San Jose, Calif. (2005), a Ta capping layer yields a higher dR/R than a Ru capping layer. This result is due to a higher oxidation potential for Ta than for Ru. It is also known that NiFe with a Ru cap is positively charged while NiFe with a Ta cap is negatively charged. Thus, Ta is much more reactive with oxygen in the free layer and is a more efficient "getter" than Ru. As stated by W. Egelholf et. al in "Oxygen as a surfactant in the growth of giant magnetoresistive spin valve" in J. Appl. Phys., 82, p.6142-51 (1997), oxygen is highly mobile in the transition metals and alloys thereof such as NiFe, CoFe, Cu, and Ru and has a strong tendency to float out to the surface. During thermal annealing, Ta is capable of gettering oxygen atoms originating in the NiFe free layer. Consequently, the NiFe free layer is less oxygen contaminated and a more distinct boundary between the tunnel barrier layer and NiFe free layer is thereby obtained to improve dR/R. The disadvantage of using a Ta capping layer is that Ta diffuses into NiFe during thermal annealing to produce an alloy that not only reduces free layer moment (Bs) but makes NiFe very magnetostrictive with a $\lambda_S$ of $\geq 5 \times 10^{-6}$. Thus, an improved capping layer is needed that prevents inter-diffusion between a free layer and capping layer, serves as a good oxygen getter material, and enables both a high MR ratio and low $\lambda_S$ value to be achieved in MTJs for advanced MRAM and TMR read head technologies.

According to a search of the prior art, hafnium (Hf) has been used in various ways to influence the performance of magnetic devices. In U.S. Pat. No. 6,903,909, an amorphizing agent such as Hf is inserted in a NiFe pinned layer to form a NiFe/NiFeHf/NiFe configuration that smoothes the pinned layer and thereby reduces FM coupling between the pinned layer and free layer. U.S. Patent Application 2006/0114716 describes a non-magnetic hafnium layer that is inserted into a free layer to lower the switching magnetic field by weakening the exchange coupling between the two adjacent ferromagnetic layers. U.S. Patent Application 2006/0023492 discloses a MTJ with a low aspect ratio elliptical shape in which magnetic layers are doped with various elements like Hf to facilitate a flux closure configuration and a vortex magnetization state in the free layer and reference layer. In U.S. Patent Application 2002/0054462, a MTJ with an insulating barrier made of an oxidized thin metallic alloy of Ni and another non-magnetic material such as Hf is described that produces a barrier layer with a relatively low barrier height that allows low junction resistance and a high TMR ratio. U.S. Patent Application 2006/0056114 discloses a composite magnetic layer that may include Hf which is formed between a tunnel barrier and a pinned layer to prevent migration of Ni or Mn into the tunnel barrier.

Magnetic layers comprised of an alloy may be deposited by a sputtering technique. There are several references in the prior art where a magnetic layer is deposited in a sputtering system by co-sputtering two targets. In U.S. Pat. No. 6,893,714 and related U.S. Patent Application 2005/0271799, a ferromagnetic alloy and a non-magnetic oxide are co-sputtered to form a magnetic layer. U.S. Patent Application 2006/0002026 describes a reactive sputtering process where a magnetic recording material and a matrix material such as $SiO_X$ may be co-deposited on a substrate. U.S. Patent Application 2002/0045070 describes co-sputtering with a non-magnetic target (oxide) and a magnetic target to form fine magnetic dots dispersed in a non-magnetic matrix.

SUMMARY OF THE INVENTION

One objective of the present invention is to provide a low magnetization capping layer in an MTJ element that is efficient in gettering oxygen atoms from an adjacent free layer.

A second objective of the present invention is to provide a low magnetization capping layer in accordance with the first objective that also blocks inter-diffusion between the capping layer and an adjacent free layer.

A third objective of the present invention is to provide a low magnetization capping layer in accordance with the second objective that enables the resulting MTJ element to achieve a high dR/R of about 30% or greater and an acceptable resistance (RA) value.

A fourth objective of the present invention is to provide a method of forming a low magnetization capping layer that satisfies the first three objectives.

According to a first embodiment, these objectives are achieved by providing a substrate comprised of a bottom conductor electrode on which an MRAM structure is to be fabricated. An MTJ element is formed by first depositing a stack of layers on the bottom conductor electrode. In one aspect, the MTJ stack has a bottom spin valve configuration in which a seed layer, AFM layer, synthetic anti-ferromagnetic (SyAF) pinned layer, tunnel barrier layer, free layer, and a capping layer are sequentially formed. Preferably, the pinned layer has a synthetic anti-ferromagnetic (SyAF) configuration wherein a Ru coupling layer is sandwiched between two CoFe layers. The tunnel barrier layer may be comprised of amorphous AlOx, AlTiOx, or crystalline MgO. Above the tunnel barrier layer is a free layer comprised of NiFe that may have a Fe content of about 8 to 21 atomic % to minimize magnetostriction. A key feature is the capping layer which has a low moment and has a composite structure in which an inner layer adjacent to the free layer is made of NiFeHf that serves as an oxygen getter agent and helps to reduce inter-diffusion between the capping layer and adjacent free layer. In a preferred embodiment, the composite capping layer is a trilayer structure having a composition represented by NiFeHf/Ta/Ru in which a Ta layer is sandwiched between an inner NiFeX layer and an outer Ru layer. All of the layers in the MTJ stack are formed by sputtering or ion beam deposition (IBD). The tunnel barrier layer is typically formed by depositing a metal or alloy and then oxidizing the metal by a radical oxidation (ROX) method, for example. The inventors have found that the best method of depositing the NiFeHf layer is to co-sputter NiFe and Hf. Once all the layers in the stack are laid down and thermally annealed to fix the pinned layer magnetization direction, a conventional patterning and etching sequence is followed to fabricate a MTJ element. Thereafter, a dielectric layer is typically deposited on the substrate and MTJ and is thinned to be coplanar with the capping layer. A top conductor may then be formed on the MTJ and dielectric layer.

In a second embodiment, the MTJ element is formed as a sensor in a TMR read head. A bottom shield such as a NiFe layer with an overlying shield capping layer made of Ta or the like is formed on a substrate. An MTJ stack of layers as described in the first embodiment is then laid down on the shield capping layer. Preferably, the MTJ stack has a composite free layer comprised of CoFe with a Fe content of greater than about 25 atomic % and NiFe in which the Fe content is less than about 17.5 atomic %. The low moment capping layer preferably has a NiFeHf/Ta/Ru composition as described previously. The MTJ element is fabricated by a known patterning and etching sequence. A dielectric layer is generally formed on either side of the MTJ element to separate the MTJ from a subsequently deposited hard bias layer that provides longitudinal biasing to the free layer. A second dielectric layer may be formed on the hard bias layer and is coplanar with the top surface of the MTJ. A top lead which is the upper shield is disposed on the top surface of the MTJ and on the second dielectric layer.

BRIEF DESCRIPTION OF THE DRAWINGS

FIG. 1 is a cross-sectional view showing a conventional MTJ element formed between bottom and top shields and which serves as a sensor in a TMR read head FIG. 2 is cross-sectional view of a partially formed MRAM structure in which an MTJ element containing a low moment capping layer is formed on a substrate according to a first embodiment of the present invention.

FIG. 3 is a cross-sectional view of the MRAM structure in FIG. 2 after a photoresist mask is removed and an insulation layer is formed adjacent to the MTJ element and a bit line is formed on the top surface of the MTJ element.

DETAILED DESCRIPTION OF THE INVENTION

Figure 4:
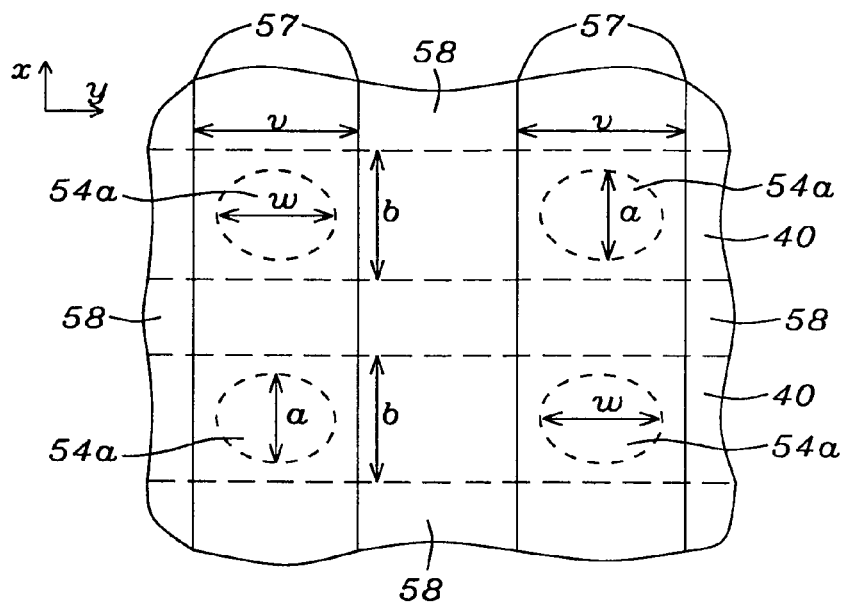
FIG. 4 is a top view of an MRAM array in FIG. 3 in which an array of elliptically shaped MTJ elements is interposed between bit lines and word lines.

The present invention is a low magnetization (low moment) capping layer for an MTJ element in which the capping layer is a composite with a NiFeHf inner layer formed on an adjacent free layer. The low moment NiFeHf capping layer serves as an oxygen getter agent and an interdiffusion barrier between the capping layer and free layer to enable the MTJ element to achieve higher dR/R values than previously reported in the prior art. Moreover, resistance (RA value) and other magnetic properties are maintained within acceptable levels for use in high density devices with small MTJ sizes. Although only MRAM and TMR read head embodiments are described herein, the present invention may be employed in other technologies based on an MTJ element as appreciated by those skilled in the art. Drawings are provided by way of example and are not intended to limit the scope of the invention. Further, the drawings are not necessarily drawn to scale and the relative sizes of various elements may differ from those in an actual device.

An MRAM structure formed according to a first embodiment of the present invention will now be described. Referring to FIG. 2, a partially completed MRAM structure 36 is shown that includes a substrate 38 which may be silicon or another semiconductor substrate used in the art that typically contains devices such as transistors and diodes. A first insulation layer 39 comprised of $Al_2O_3$, silicon oxide, or the like is disposed on the substrate 38. There is a first conductive line comprised of copper, for example, formed within and coplanar with the first insulation layer 39. For the purpose of this discussion, the first conductive line is a word line 40 that is used to conduct current in a +y or −y direction. Optionally, the first conductive line may be called a digit line, data line, row line, or column line as appreciated by those skilled in the art. The word line 40 may be enclosed on the sides and bottom by a thin diffusion barrier layer or a cladding layer (not shown). There is a second insulation layer 41 such as $Al_2O_3$ or silicon oxide formed on the word line 40 and first insulation layer 39. Above the second insulation layer 41 is a bottom conductor layer 45 that is interconnected to an underlying transistor (not shown) in substrate 38. The bottom conductor layer 45 is typically coplanar with an insulation layer (not shown). In one aspect, the bottom conductor layer 45 is a composite layer having a seed layer 42/conductive layer 43/capping layer 44 configuration.

It should be understood that the MRAM structure is part of an MRAM array in which multiple parallel word lines are formed in a first conductive layer and multiple top conductor electrodes such as parallel bit lines are formed in a second conductive layer above an array of MTJs. Alternatively, the first conductive layer may be parallel bit lines while the second conductive layer is parallel word lines. The word lines and bit lines are aligned orthogonal to each other and a bottom conductor layer may be used to connect each MTJ element with a transistor in the substrate. In the exemplary embodiment, an MTJ element is formed between a bottom conductor layer and bit line at each location where a bit line crosses over a word line.

The bottom conductor layer 45 may be a sectioned line, for example, that has a rectangular shape in the x,y plane and a thickness in the z direction. Alternatively, the bottom conductor layer 45 may be a bit line that is aligned orthogonally to an underlying word line 40 and to a subsequently formed second word line above the MTJ. In one embodiment, the bottom conductor layer 45 may have a NiCr/Ru/Ta configuration in which a seed layer 42 formed on the second insulation layer 41 is made of NiCr. Optionally, the seed layer 42 may be comprised of Ta or TaN. Above the seed layer 42 is a conductive layer 43 which is preferably comprised of Ru although Rh or Ir may be used, instead. Alternatively, other metals such as Au, Cu, or α-Ta may be used as the conductive layer 43. Note that when α-Ta is employed as the conductive layer 43, it is in a low resistance phase and is typically grown on a TaN seed layer 42. Further, Ta preferably has an amorphous phase when employed as the capping layer 44 on a Ru conductive layer 43.

The capping layer 44 may be a Ta layer with a thickness from about 30 to 50 Angstroms that has an amorphous character as a result of a sputter etching process. According to one embodiment, the seed layer 42, conductive layer 43, a Ta capping layer 44, and an overlying Ru layer (not shown) are sequentially deposited to give a TaN/NiCr/Ru/Ta bottom conductor configuration by a sputtering or ion beam deposition (IBD) on the second insulation layer 41. As described in Headway patent application HT03-022 which is herein incorporated by reference in its entirety, a Ru layer and a portion of the underlying Ta layer in the bottom conductor layer 45 are removed by sputter etching to generate an amorphous Ta capping layer that serves to promote uniform and dense growth in subsequently formed MTJ layers.

An MTJ stack of layers is now formed on the bottom conductor layer 45. It should be understood that the MTJ stack may be formed in the same process tool as the bottom conductor layer. For instance, the bottom conductor layer 45 and MTJ stack may be formed in an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas and the targets are made of metal or alloys to be deposited on a substrate. The bottom conductor layer 45 and overlying MTJ layers may be formed after a single pump down of the sputter system to enhance throughput.

In a preferred embodiment, the MTJ stack of layers is fabricated on the bottom conductor layer 45 by sequentially forming a seed layer 46, AFM layer 47, SyAF pinned layer 48, tunnel barrier layer 49, free layer 50, and a cap layer 54. The seed layer 46 may have a thickness of about 40 to 60 Angstroms and is preferably a layer of NiCr with a thickness of 45 Angstroms and a Cr content of about 35 to 45 atomic %. However, NiFe or NiFeCr may be used as the seed layer 46 instead of NiCr. Since the seed layer 46 is grown on an amorphous Ta capping layer 44, a smooth and dense <111> seed layer structure results that promotes smooth and densely packed growth in subsequently formed MTJ layers.

The AFM layer 47 is preferably made of MnPt with a thickness of about 100 to 200 Angstroms and more preferably 150 Angstroms although an IrMn layer having a thickness from about 50 to 100 Angstroms or a film made of NiMn, OsMn, RuMn, RhMn, PdMn, RuRhMn, or MnPtPd are also acceptable. In the exemplary embodiment, the AFM layer is magnetically aligned in the y direction. An external magnetic field may be applied during the deposition of an MTJ layer such as an AFM layer or a ferromagnetic (FM) layer to influence a magnetization along a certain axis.

The SyAF pinned layer 48 has an AP2/Ru/AP1 configuration. Use of a SyAF pinned layer in the MTJ structure not only improves thermal stability but also reduces the interlayer coupling field (offset field) applied to the free layer. The AP2 layer is formed on the AFM layer 47 and is preferably comprised of CoFe with a composition of about 10 atomic % Fe and with a thickness of about 20 to 30 Angstroms and more preferably 23 Angstroms. The magnetic moment of the AP2 layer is pinned in a direction anti-parallel to the magnetic moment of the AP1 layer. A slight difference in thickness between the AP2 and AP1 layers produces a small net magnetic moment for the SyAF pinned layer 48 along the y axis. Exchange coupling between the AP2 layer and the AP1 layer is facilitated by a coupling layer that is preferably comprised of Ru with a thickness of about 8 Angstroms although Rh or Ir may be used instead of Ru. In one embodiment, the AP1 layer on the Ru coupling layer is comprised of CoFe with a composition of about 25 to 50 atomic % Fe and a thickness of about 15 to 25 Angstroms and more preferably 20 Angstroms. Optionally, the AP1 layer may be a composite layer that includes a thin nano-oxide layer (NOL) such as FeTaO or CoFeO sandwiched between CoFe layers. The nano-oxide layer is employed to increase smoothness in the AP1 layer.

Above the SyAF pinned layer 48 is formed a thin tunnel barrier layer 49 which may be an oxidized Al layer that has an oxygen content which is close to an $Al_2O_3$ stoichiometry and is hereafter referred to as an AlOx layer. Initially, an Al layer having a thickness of about 7 to 10 Angstroms is deposited on the SyAF pinned layer 48 and is subsequently oxidized by an in-situ radical oxidation (ROX), for example. The resulting AlOx layer has a thickness of about 10 to 15 Angstroms and preferably 12 Angstroms. The tunnel barrier layer 49 has excellent smoothness and uniformity because of the smooth and densely packed seed layer 46, AFM layer 47, and SyAF pinned layer 48 grown on the Ta capping layer 44. Optionally, the tunnel barrier layer 49 may be made of AlTiOx or crystalline MgO as appreciated by those skilled in the art.

It has been shown that an MTJ made with a crystalline MgO barrier layer and a CoFeB free layer is capable of delivering a very high dR/R of more than 200% as published in a press release on Sep. 7, 2004 by the National Institute of Advanced Industrial Science and Technology (AIST) entitled "TMR device with world best performance fabricated by mass manufacturing system" at the web site http://www.aist-.go.jp.aist_e/latest_research/2004/20040907/20040907.html. Such a huge dR/R is a result of coherent tunneling in which electron symmetry of the ferromagnetic electrode is preserved in tunneling through the crystalline MgO barrier. Formation of an appropriate MgO tunnel barrier according to the present invention will be described in a second embodiment.

The free layer 50 formed on the tunnel barrier layer 49 may be made of a moderate spin polarization material as understood by those skilled in the art. A high spin polarization material is defined as a CoFe alloy in which the atomic % of Fe is >20%, a NiFe alloy in which the atomic % of Fe is >40%, or a $[(CoFe)_m B_n]$ alloy with $\geq 25$ atomic % Fe in the CoFe composition. More generally, a high spin polarization material is one which has a magnetization saturation (Ms) value equal to or greater than the aforementioned alloys and a moderate spin polarization material is defined as one which has an Ms value less than the aforementioned alloys.

A moderate spin polarization material helps to minimize the magnetostriction ($\lambda_S$) in the MTJ element. For example, a NiFe layer in which the Fe content is between about 8 atomic % and 21 atomic % may be advantageously employed as the free layer 50. In this case, the NiFe layer has a thickness between 30 and 60 Angstroms. The free layer 50 is magnetically aligned along the y-axis (pinned layer direction). When the MTJ is elliptically shaped as seen in a top view (FIG. 4), the easy axis of the MTJ element is along the long axis (y-direction).

A key feature of the present invention is the capping layer 54 which has a low moment and is a composite with an inner layer 51 that is preferably comprised of NiFeHf and is formed on the free layer 50. A low moment NiFeHf layer is defined as one having a low moment (Bs) of less than 30% of the underlying NiFe free layer Bs wherein the free layer (adjacent to the NiFeHf layer) has a Fe content of less than or about 17.5 to 20 atomic %. A NiFeHf layer according to the present invention is defined as non-magnetic (i.e. no moment) when formed on a $SiO_2$ layer. Note that when the NiFe free layer 50 has a 20 atomic % Fe content, hereafter referred to as NiFe (20%), the NiFeHf inner layer 51 is made by co-sputtering NiFe (20%) and Hf and has a $[NiFe(20\%)]_{1-X}Hf_X$ composition. Likewise, when the NiFe free layer has a 17.5% Fe content, also known as NiFe (17.5%), the NiFeHf inner layer 51 is made by co-sputtering NiFe (17.5%) and Hf and has a $[NiFe(17.5\%)]_{1-Y}Hf_Y$ composition. In this case, the Hf concentration for a non-magnetic $[NiFe(17.5\%)]_{1-Y}Hf_Y$ layer is less than that of a $[NiFe(20\%)]_{1-X}Hf_X$ layer.

In one aspect, as shown in FIG. 2, the capping layer 54 has a NiFeHf/Ta/Ru configuration in which a NiFeHf inner layer 51 with a thickness of about 10 to 50 Angstroms is disposed on the free layer 50. Although other elements such as Mg, Nb, and Zr may be used instead of Hf in a NiFeX capping layer as described in MagIC Technologies, Corp. patent application HMG06-005 which is herein included by reference in its entirety, Hf has a higher oxidation potential (lower electronegativity) than Mg, Nb, and Zr and is therefore preferred as an oxygen gettering agent. Moreover, the lattice parameter and crystal structure of a low moment NiFeHf inner layer 51 are a good match with a NiFe free layer 50. The NiFeHf inner layer 51 is preferably made from a NiFe target that has essentially the same Fe content as the underlying NiFe free layer 50 in order to provide good lattice matching between the free layer and NiFeHf inner layer. A co-sputtering method for forming the NiFeHf layer of the present invention is described in a later section.

Hafnium also has a larger oxidation potential than Ni, Fe, and Co and therefore is very effective in gettering oxygen from an adjacent NiFe free layer 50 or from a CoFe(B)/NiFe free layer in a TMR embodiment to be described in a later section. An additional advantage in gettering power is achieved by forming the NiFeHf layer adjacent to the free layer 50. Previously, the inventors have practiced a process in which a Ru/Ta/Ru trilayer configuration was employed as a capping layer. However, the primary getter agent, Ta, is one layer removed from the free layer in this configuration and a Ru inner layer leads to dR/R degradation.

The exact composition of the NiFeHf inner layer 51 is dependent on the NiFe free layer 50 composition since a NiFe composition similar to that in the NiFe free layer is used in a target during formation of the NiFeHf layer. According to the present invention, the Hf content in the NiFeHf inner layer 51 may vary from about 10 to 25 atomic %. The Hf content in a NiFeHf layer that was formed by co-sputtering NiFe with 21 atomic % Fe and Hf onto a $SiO_2$ substrate was analyzed. There is an onset of non-magnetic behavior in the resulting NiFeHf layer at about 25 atomic % Hf. Note that a lower Hf content is needed for non-magnetic behavior when the Fe content in the NiFe target is lower than 21 atomic %. For example, a Hf content of less than 25 atomic % is needed for non-magnetic behavior in a $[NiFe (17.5\%)]_{1-Y}Hf_Y$ layer. In general, as the Hf content increases, the oxygen getter power will increase for the NiFeHf inner layer 51.

The NiFeHf inner layer 51 also functions as an inter-diffusion barrier between the NiFe free layer 50 and the middle layer 52 in the capping layer 54. Furthermore, the thickness of the NiFeHf inner layer 51 and the composition of the underlying free layer 50 can be adjusted to further reduce magnetostriction in the free layer According to M. Chen et. al in "Ternary NiFeX as a soft biasing film in a magnetoresistive sensor", J. Appl. Physics, 69, p.5631-5633 (1991), a NiFeX sputtering target with an X content greater than about 10 to 15 atomic % is not manufacturable because of its brittleness. The inventors have discovered that the preferred method for depositing a NiFeHf layer 51 in an MTJ stack is by co-sputtering of NiFe and Hf targets. In one embodiment, an Anelva C-7100 sputter deposition system is employed that has multiple sputter deposition chambers and at least one sputter (PVD) chamber capable of co-sputtering. The NiFe target and Hf target are placed at alternating positions in a sputter (PVD) chamber. For example, the NiFe target may be placed at position 2 while the Hf target is located at target position 4. Optionally, the NiFe target may be placed at position 1 and the Hf target at position 3. In one embodiment, the NiFe target has an Fe content of between 8 atomic % and 21 atomic %.

It should be understood that the sputter deposition rate of a specific metal is dependent on the sputter power applied to the target cathode. Thus, the concentration of the Hf component in a NiFeHf layer is controlled by the power applied simultaneously to the two respective targets. Note that the Hf deposition rate is slower than the NiFe deposition rate using the same applied power. To compensate for the unequal deposition rates, a higher forward power is applied to the NiFe target than to the Hf target. The preferred deposition method comprises applying a forward power of 100 Watts (W) to 300 W, and more preferably 100 W to 200 W to the Hf target and a forward power of 200 W to 600 W, and more preferably 300 W to 500 W to the NiFe target to deposit a NiFeHf layer at a pressure less than about 0.3 mTorr and at an ambient temperature. It should be understood that the Hf content in a 300 W/300 W (NiFe power/Hf power) co-sputtered film is higher than in a 300 W/200 W co-sputtered film.

In an embodiment where the NiFeHf inner layer 51 is formed by co-sputtering a NiFe (21%) target and a Hf target, a forward power of 400 W may be applied to the NiFe (21%) target and a forward power of 200 W to the Hf target to yield a non-magnetic NiFeHf layer. In an example where the NiFe free layer 50 has a Fe content of 10 atomic % as in NiFe (10%), a NiFeHf inner layer 51 may be formed by co-sputtering a NiFe (10%) target and a Hf target with a forward power of 400 W and 100 W, respectively. In this case, the onset of non-magnetic behavior in NiFeHf is about 10 atomic % Hf.

The $B_S$ (magnetic moment) of a co-sputtered NiFeHf film is measured with a B—H looper. Composition of the non-magnetic NiFeHf alloy is analyzed with a well known EDX system in Transmission Electron Microscopy. The present invention also encompasses an embodiment in which a NiFeHf target is sputtered to form a NiFeHf layer although the technology does not currently exist to fabricate a non-brittle NiFeHf target of sufficient size to be useful in manufacturing.

Referring again to FIG. 2, above the inner layer 51 is a middle layer 52 which is preferably a Ta layer having a thickness from 30 to 50 Angstroms. The Ta layer 52 also functions as an oxygen getter layer in this configuration but is less effective than the inner layer 51. The Ta layer 52 is preferably an α-phase Ta layer with a low resistance. Optionally, another conductive layer may be used instead of Ta as the middle layer 52 in the capping layer 54. The outer layer 53 is preferably comprised of Ru having a thickness of about 30 to 100 Angstroms to prevent oxidation of the Ta layer 52 and to preserve the Ta oxidation potential. Other desirable properties of the Ru outer layer 53 are that it ensures good electrical contact with an overlying bit line (not shown), is inert to oxidation during annealing, and is a low resistance conductor. Moreover, the Ru outer layer 53 is advantageously employed as a stopping layer during a chemical mechanical polish (CMP) process that removes an overlying Ta hard mask (not shown) at a later stage in the fabrication sequence.

It is believed that the mechanism responsible for increasing the MR ratio involves gettering oxygen in the free layer 50 by the NiFeHf layer 51 and to a lesser extent by a Ta layer 52 in the capping layer 54. By employing a capping layer 54 having a NiFeHf inner layer, the underlying free layer 50 is less oxygen contaminated and has higher conductivity, thereby improving dR/R. Another benefit of a NiFeHf inner layer 51 is that the "dead layer" between the free layer and an overlying Ru/Ta/Ru capping layer in the prior art is substantially reduced. The dead layer is typically a 3 to 6 Angstrom thick interface between the free layer and capping layer wherein some intermixing of layers has occurred. For example, Ru or Ta may migrate into a NiFe free layer and thereby reduce the magnetic moment of the free layer and dR/R of the MTJ. A dead layer is indicative of poor lattice matching between the free layer and adjoining capping layer.

The present invention also encompasses an annealing step after all of the MTJ layers have been deposited. For example, in the exemplary embodiment, the MTJ stack of layers having an AlOx tunnel barrier layer may be annealed by applying a magnetic field of 10K Oe in magnitude along the y-axis for 5 hours at a temperature above 250° C. and preferably about 280° C. Optionally, when the tunnel barrier is comprised of MgO, the annealing process is typically in the range of 300° C. to 350° C.

After all of the MTJ layers have been deposited and annealing is completed, an MTJ element with sidewalls and a top surface 54a is fabricated by first coating and patterning a photoresist layer 55 that has a width w on the capping layer 54. Next, the photoresist layer 55 is employed as an etch mask during an IBE or Reactive Ion Etch (RIE) sequence that removes regions of the MTJ stack of layers 46-54 which are not protected by the etch mask. As indicated earlier, a hard mask layer (not shown) such as Ta about 400 Angstroms thick may be deposited on the capping layer 54 prior to coating the photoresist layer 55. The patterned photoresist layer 55 serves as an etch mask during a RIE process to remove unprotected regions of the hard mask layer. Then the photoresist layer 55 is stripped and the hard mask serves as a mask for a second RIE process that etches unprotected regions of layers 46-54. Thereafter, the hard mask may either remain on the capping layer 54 or be stripped by a conventional method such as CMP. As a result, an MTJ element is formed that typically has sloped sidewalls in which the capping layer 54 has a width w and the seed layer 46 has a width greater than w.

Referring to FIG. 3, the photoresist layer 55 is removed after the aforementioned IBE or RIE etch sequence by a conventional method that may involve a wet stripper or an oxygen ashing process. A standard cleaning step may be performed at this point to ensure that all organic residue is removed after the stripping step. Then a third insulation layer 56 is formed on the bottom electrode 45 and adjacent to the MTJ sidewalls by a conventional method that may involve depositing an insulation material with an appropriate dielectric constant and then planarizing the third insulation layer 56 to be coplanar with the top surface 54a of the MTJ element.

The next step in fabricating the MRAM cell 40 is to form a top conductor (bit line) 57 on the third insulation layer 56 that contacts the top surface 54a of the MTJ element. The bit line 57 is aligned in a direction orthogonal to that of the word line 40 and may be comprised of more than one layer. For instance, a top conductor layer such as Cu, Au, or Al may be enclosed on the sides and bottom by a diffusion barrier layer as appreciated by those skilled in the art. Optionally, there may be a cladding layer on one or more sides of the bit line 57. In the exemplary embodiment, the bit line 57 is used to carry current in a +x or −x direction and the word line 40 has a lengthwise direction along the y-axis. When the bottom conductor layer 45 is a sectioned line with a rectangular shape, a longer side may be formed in the y direction and the shorter side may be formed in the x direction. According to a well known right hand rule, a current flowing through the bit line 57 generates a first magnetic field in the easy axis direction of the free layer while a current in the word line 40 produces a second magnetic field in the hard axis direction during a write operation. The direction of flow and magnitude of the bit line current and word line current is changed to align the magnetization of the free layer 50 in a particular direction.

Referring to FIG. 4, a top view of a portion of an MRAM array is shown that is comprised of four MRAM cells, four MTJ elements, two word lines 40 and two bit lines 57. The bottom conductor layer 45 is not shown in order to simplify the drawing. The word lines 40 have a width b and bit lines 57 have a width v. It should be understood that the bit lines 57 are coplanar with a fourth insulation layer 58 that may contain the same dielectric material as in the first, second, and third insulation layers 39, 41, 56. In a preferred embodiment, the top surface 54a of the MTJ element and each layer 46-54 within the MTJ has an elliptical shape with a length w along the long axis (y-direction) and a width a along the short axis (x-direction). However, the present invention also anticipates MTJ shapes that are circular, rectangular, diamond-shaped, or eye-shaped from a top-down view. The width v of a bit line 57 may be larger than the length w and the width b of a word line 40 may be larger than the width a of an MTJ element.

Figure 5:
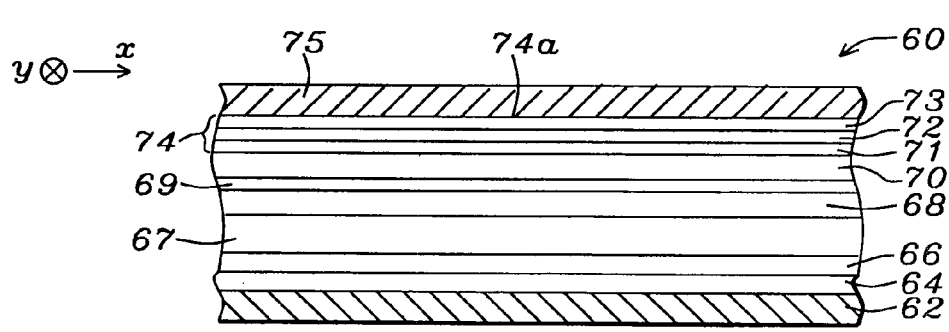
FIG. 5 is a cross-sectional view of a partially formed TMR read head in which an MTJ element containing a low magnetization capping layer is formed on a substrate according to a second embodiment of the present invention.
Figure 6:
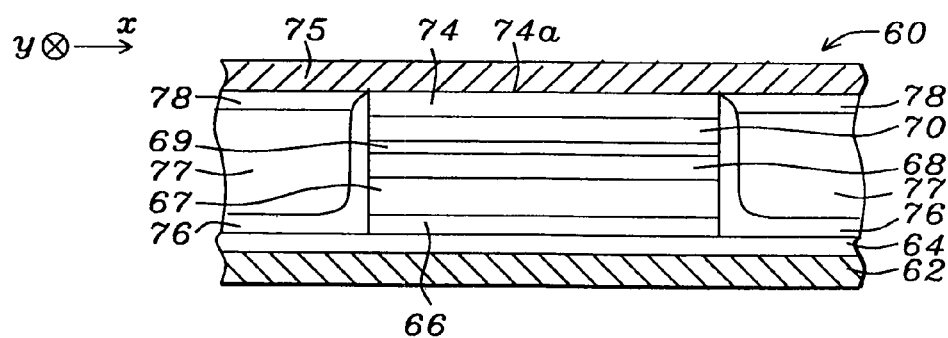
FIG. 6 is a cross-sectional view of a TMR read head in FIG. 5 where the MTJ element is formed between a bottom shield and an upper shield and is separated from a hard bias layer by an insulation layer.

In a second embodiment depicted in FIG. 5, a tunneling magnetoresistive (TMR) read head 60 is shown in which an MTJ element is formed between a bottom conductor hereafter referred to as a bottom (S1) shield 62 and a top conductor hereafter referred to as an upper (S2) shield 75. A capping layer 74 comprised of a NiFeHf layer 71 is formed on a free layer 70 in the MTJ to enhance dR/R and provide an acceptable $\lambda_S$ value.

A substrate 62 is provided that may be a bottom shield comprised of NiFe in the TMR read head 60 as is understood by those skilled in the art. In one aspect, a shield capping layer 64 is formed on the bottom shield 62 by a previously described method that involves sequentially depositing a Ta layer with a thickness of about 50 to 80 Angstroms and a Ru layer with a thickness of between 20 and 30 Angstroms on the bottom shield 62. Thereafter, the Ru layer is removed by a sputter etch process that also partially removes the underlying Ta layer to form an amorphous Ta layer as the shield capping layer 64. The shield capping layer 64 has a thickness of about 30 to 50 Angstroms and is employed to promote a smooth and dense growth of layers in a subsequently formed MTJ element. Optionally, the shield capping layer 64 may be comprised of a composite layer in which the bottom layer functions as a capping layer for the bottom shield 62 and also promotes smooth and dense growth in subsequently formed layers as appreciated by those skilled in the art. A capping layer for an S1 shield may be amorphous $(Co_{75}Fe_{25})_{0.8}B_{0.2}$, for example.

An MTJ stack of layers is now formed on the shield capping layer 64 and may be deposited in the same process tool in which the shield capping layer is formed. Preferably, the process tool is an Anelva C-7100 sputtering system or the like which includes at least one sputter (PVD) chamber capable of co-sputtering and has the capability to form all layers in the MTJ stack of layers after a single pump down step.

In one embodiment, an MTJ stack of layers is fabricated on the shield capping layer 64 by sequentially forming a seed layer 66, AFM layer 67, SyAP pinned layer 68, tunnel barrier layer 69, free layer 70, and a capping layer 74. The seed layer 66 may be a NiCr layer with the same thickness and composition as the seed layer 46 in the first embodiment. Similarly, the AFM layer 67, SyAP pinned layer 68, and tunnel barrier layer 69 may have the same composition as described for AFM layer 47, SyAP pinned layer 48, and tunnel barrier layer 49, respectively, in the first embodiment. However, in the TMR read head 60, the initially deposited Al layer is about 4 to 6 Angstroms thick and is subsequently oxidized by a natural oxidation (NOX) process or a radical oxidation (ROX) to form the tunnel barrier layer 69. Preferably, the free layer 70 is a composite layer with a FeCo/NiFe configuration in which the FeCo alloy formed on the tunnel barrier layer 69 has a Fe content of about 90 atomic % and a thickness of between 5 to 10 Angstroms with 10 Angstroms being preferred while the overlying NiFe layer has a Fe content of about 8 to 14 atomic % and a thickness between about 30 and 40 Angstroms. The free layer 70 may be magnetically aligned in the x direction during deposition. Alternatively, the free layer 70 may have a configuration represented by CoFeB/NiFe wherein the CoFeB layer adjacent to the tunnel barrier layer 69 may have a $(Co_{75}Fe_{25})_{0.8}B_{0.2}$ composition, for example.

A key feature of the second embodiment is the capping layer 74 which is preferably a trilayer comprised of an inner NiFeHf layer 71, a middle layer 72, and an outer layer 73 formed on the free layer 70. For a TMR read head, the NiFeHf inner layer 71 has a similar thickness and properties as previously described for NiFeHf layer 51. The required Hf content necessary to form a low magnetization NiFeHf inner layer 71 is believed to be at least 10 atomic % while the Fe content is preferably the same as the Fe content in the adjacent NiFe free layer 70. The NiFeHf inner layer 71 serves as an oxygen gettering layer to remove oxygen from the free layer 70.

The middle layer 72 and outer layer 73 have properties and a composition similar to the middle layer 52 and outer layer 53, respectively, in the first embodiment. The outer layer 73 forms a smooth surface for optimizing electrical contact with the overlying top lead which is the upper (S2) shield of the TMR read head.

The present invention also encompasses one or more annealing steps after all of the layers in the MTJ stack have been deposited. For example, the AFM layer may be annealed while applying an external magnetic field along the y-axis. In the case of a TMR read head, the free layer may be annealed by applying a smaller external magnetic field along the x-axis. Annealing steps for TMR read head fabrication typically are performed at a temperature equal to or greater than 250° C.

After all of the MTJ layers have been deposited, an MTJ element in a TMR head may be fabricated by forming a lift-off photoresist pattern (not shown) on the top surface 74a followed by IBE or RIE etching to selectively remove portions of the MTJ stack of layers 66-74 which are not protected by the photoresist mask. As a result, an MTJ element is formed that typically has sloped sidewalls wherein the width of the seed layer 66 is greater than the width of the capping layer 74 and the width of the top surface 74a determines the track width. Note that RIE typically produces MTJ sidewalls with less sloping than when IBE is used.

After the IBE or RIE process, a dielectric layer 76 comprised of $Al_2O_3$, for example, is deposited to a thickness of about 100 to 150 Angstroms by a chemical vapor deposition (CVD) or physical vapor deposition (PVD) on the sidewalls of the MTJ element and on the shield capping layer 64. Next, a hard bias layer 77 having a TiW/CoCrPt/Ta configuration, for example, and a second $Al_2O_3$ dielectric layer 78 are sequentially deposited on the first dielectric layer 76. The hard bias layer may have a thickness of about 200 to 300 Angstroms and the second dielectric layer has a thickness between about 200 and 250 Angstroms. The photoresist mask and overlying layers 76-78 are lifted off by a conventional method to uncover the top surface 74a. Note that the top surface 74a is preferably coplanar with the adjacent second dielectric layer 78. A CMP step may be employed to planarize the second dielectric layer. An upper shield 75 is then formed on the top surface 74a and second dielectric layer 78 to complete the TMR read head 60.

EXAMPLE 1

An experiment was conducted to determine the magnetic moment (Bs) of 500 Angstrom thick NiFeHf layers on a $SiO_2/Si$ substrate that were co-sputtered using an Anelva C-7100-Ex Thin Film Sputtering System which consists of three 5PVD chambers each having five targets, an oxidation chamber, and a sputter etching chamber. At least one of the 5PVD chambers is capable of co-sputtering. The NiFe target and Hf target were arranged opposite each other at positions 2 and 4, respectively. The magnetic moment of each 500 Angstrom thick film shown in Table 1 was measured with a B—H looper.

TABLE 1

| Bs (nanowebers) of 500 Angstrom Thick NiFeHf Layers | | |
|---|---|---|
| NiFe power/Hf power | Bs (as-deposited) | Bs (annealed) |
| NiFe (reference) | 10.8 | 10.8 |
| 300 W/300 W | none | none |
| 300 W/200 W | none | 0.29 |
| 400 W/200 W | very slight | 0.61 |
| 600 W/200 W | 0.54 | 0.89 |
| 700 W/200 W | 3.32 | 3.35 |
| 800 W/200 W | 3.47 | 3.64 |

Based on the Bs measurements, a nonmagnetic NiFeHf alloy, in the as-deposited state, is formed by co-sputtering NiFe (21%) and Hf targets with 300 W/300 W or 300 W/200 W sputtering power. The magnetic moment of the 600 W/200 W NiFeHf film is less than 10% of the NiFe (21%) bulk target shown as the reference. In some cases, the magnetic moment increases slightly after a 5 hour annealing at 280° C.

EXAMPLE 2

An unpatterned MTJ stack was formed on a substrate to determine the improvement in magnetic properties realized by incorporating a capping layer formed according to the present invention. In this example, the tunnel barrier layer is made of MgO and the free layer is a 33 Angstrom thick $Ni_{79}Fe_{21}$ layer. The capping layer has a NiFeHf/Ta/Ru configuration wherein the NiFeHf inner layer is about 25 Angstroms thick, the thickness of the Ta middle layer is 30 Angstroms, and the thickness of the Ru outer layer is 100 Angstroms. A standard capping layer represented by Ru30/Ta30/Ru100 was also deposited on the $Ni_{79}Fe_{21}$ free layer to serve as a reference as shown in rows 1 and 2 of Table 2. After all the films were deposited, the MTJ stack was annealed at 360° C. for 2 hours with an applied field of 10000 Oe. The results in Table 2 were obtained by using a B—H looper and a Capres CIPT (current in plane tunneling) to measure RA and dR/R. The other layers in the MTJ stack are the following: seed layer (NiCr45); AFM layer (MnPt150); and pinned layer $[Co_{75}Fe_{25}21.4/Ru7.5/(Co_{75}Fe_{25})_{0.8}B_{0.2}21]$.

TABLE 2

| | Magnetic Properties of NiFe(free)-MgO MTJs with Different NiFeHf Capping Layers | | | | | | | |
|---|---|---|---|---|---|---|---|---|
| Row | MgO Tunnel Barrier | Cap | RA | MR (%) | Bs (nw) | Hin (Oe) | He (Oe) | Hk (Oe) |
| 1 | Mg12/R90"/Mg3/R40"/Mg2 | Ru30/Ta30/Ru100 | 1863 | 67.2 | 0.65 | 4.36 | 4.08 | 9.7 |
| 2 | Mg12/R90"/Mg3/R60"/Mg2 | Ru30/Ta30/Ru100 | 2039 | 68.1 | 0.65 | 4.39 | 4.34 | 10.2 |
| 3 | Mg12/R90"/Mg3/R20"/Mg2 | NiFeHf(400 W/200 W) 25/Ta30/Ru100 | 1755 | 83.5 | 0.68 | 5.18 | −3.91 | 10.6 |

TABLE 2-continued

Magnetic Properties of NiFe(free)-MgO MTJs with Different NiFeHf Capping Layers

| Row | MgO Tunnel Barrier | Cap | RA | MR (%) | Bs (nw) | Hin (Oe) | He (Oe) | Hk (Oe) |
|---|---|---|---|---|---|---|---|---|
| 4 | Mg12/R90"/Mg3/R30"/Mg2 | NiFeHf(600 W/200 W) 25/Ta30/Ru100 | 1157 | 86.8 | 0.78 | 5.14 | −3.55 | 12.7 |
| 5 | Mg12/R90"/Mg3/R40"/Mg2 | NiFeHf(600 W/200 W) 25/Ta30/Ru100 | 1213 | 85.1 | 0.78 | 5.17 | −3.60 | 10.9 |
| 6 | Mg12/R90"/Mg3/R60"/Mg2 | NiFeHf(600 W/200 W) 25/Ta30/Ru100 | 1477 | 91.1 | 0.77 | 5.13 | −3.62 | 11.0 |
| 7 | Mg12/R90"/Mg3/R30"/Mg2/R20" | NiFeHf(600 W/200 W) 25/Ta30/Ru100 | 2325 | 100.6 | 0.79 | 5.29 | −3.45 | 11.4 |
| 8 | Mg12/R90"/Mg3/R40"/Mg2/R20" | NiFeHf(600 W/200 W) 25/Ta30/Ru100 | 2336 | 123.3 | 0.78 | 5.28 | −3.44 | 11.1 |

As shown in rows 1 and 2, a Bs=0.65 nanoweber (unit is nanoweber for an 8" diameter wafer) is measured for the reference MTJ with a standard Ru/Ta/Ru capping layer. The MgO tunnel barriers are formed by different processes. For example, in row 8, the tunnel barrier is formed by first depositing a 12 Angstrom thick Mg layer which is subsequently oxidized by a ROX process for 90 seconds followed by depositing a 3 Angstrom thick Mg layer that is treated with a ROX process for 30 seconds followed by depositing a 2 Angstrom thick Mg layer that is treated with an ROX process for 20 seconds. Row 3 shows a Bs=0.68 for the MTJ with a 400 W/200 W NiFeHf capping layer which is 0.03 nw larger than that of the reference MTJ. Thus, the 400 W/200 W NiFeHf film is slightly magnetic, in agreement with the Bs measurement for a 500 Angstrom thick NiFeHf film (Table 1). For the 600 W/200 W co-sputtered NiFeHf films (rows 4-8), Bs is around 0.78 nw. Based on Bs=0.85 for a 500 Angstrom thick layer, Bs contribution from a 25 Angstrom thick 600 W/200 W NiFeHf cap is around 0.05 nw. Adding 0.05 nw to 0.65 nw of the reference layer gives a Bs=0.70 nw. Comparing Bs=0.78 nw for the MTJ with the 600 W/200 W co-sputter cap, there is a 0.08 nw moment discrepancy. A moment of 0.08 nw is equivalent to a 4 Angstrom thick NiFe film. Since the lattice mismatch for the NiFe/NiFeHf (with small Hf concentration) bilayer is substantially better than that of NiFe/Ru, the moment increase in the MTJ is most likely the result of restoring a 4 Angstrom thick NiFe "dead layer" which is present when a Ru layer is used as the inner capping layer and partially diffuses into the NiFe free layer.

Compared with the reference in rows 1 and 2 having a dR/R (MR)=68%, the dR/R for the NiFeHf capped MTJs has been greatly enhanced. As expected, dR/R is scaled with RA. Since RA is a strong function of barrier thickness and oxidation treatment, MgO tunnel barriers having different structures may be formed by different methods as described in MagIC Technologies, Corp. Ser. No. 11/317,388 which is included herein by reference in its entirety. For example, the sample prepared in row 6 can be modified with an addition ROX step to yield the sample in row 8 with an RA of about 2300 ohm-um$^2$ and a dR/R as high as 123%. This dR/R value is the highest ever reported for a NiFe (free)-MgO (barrier) MTJ. The combination of RA=2300 ohm-um$^2$ and dR/R>120% is more desirable for high speed MRAM than the previous high dR/R value and RA result reported by R. W. Dave et. al in "MgO based tunnel junction material for high speed Toggle MRAM", 50$^{th}$ mMM Conference, Abstract ED-05, San Jose (2005). Note that the reference MTJ which is capped with Ru/Ta/Ru affords a positive Hin while the MTJ capped with NiFeHf/Ta/Ru yields a negative Hin. Hin is the interlayer coupling field between the pinned layer and free layer. A negative value for Hin indicates anti-ferromagnetic coupling while a positive value means there is ferromagnetic coupling between the two layers. A negative Hin has been reported for the CoFeB (free)-MgO MTJ that results in an extraordinarily high dR/R of >200%. Results of this experiment tend to confirm that a giant dR/R improvement is indicated by a negative Hin value.

EXAMPLE 3

An unpatterned MTJ stack was formed on a substrate to determine the improvement in magnetic properties realized by incorporating a capping layer formed according to the present invention. In this example, the tunnel barrier layer is made of AlOx and the free layer is a 33 Angstrom thick Ni$_{79}$Fe$_{21}$ layer. The tunnel barrier was formed by oxidizing an 8 Angstrom thick Al layer. The capping layer has a NiFeHf/Ta/Ru configuration wherein the NiFeHf inner layer is about 25 Angstroms thick, the thickness of the Ta middle layer is 30 Angstroms, and the thickness of the Ru outer layer is 100 Angstroms. A standard capping layer represented by Ru30/Ta30/Ru100 was also deposited on the Ni$_{79}$Fe$_{21}$ free layer to serve as a reference as shown in row 6 of Table 3. The seed layer, AFM layer, and pinned layer are the same as in Example 2. The MTJ stacks were annealed at 280° C. for 5 hours with an applied field of 10000 Oe.

TABLE 3

Magnetic properties of NiFe(free)-AlOx MTJs with different NiFeHf capping layers

| Capping Layer | NiFe/Hf power | Bs (nw) | Hc (Oe) | RA | dR/R (%) | dR/R gain |
|---|---|---|---|---|---|---|
| NiFeHf25/Ta30/Ru100 | 300 W/300 W | 0.591 | 5.73 | 748 | 41.6 | 0 |
| NiFeHf25/Ta30/Ru100 | 300 W/200 W | 0.707 | 5.85 | 888 | 50.8 | 25% |
| NiFeHf25/Ta30/Ru100 | 400 W/200 W | 0.779 | 5.91 | 953 | 54.9 | 35% |
| NiFeHf25/Ta30/Ru100 | 500 W/200 W | 0.797 | 5.64 | 964 | 56.2 | 38% |
| NiFeHf25/Ta30/Ru100 | 600 W/200 W | 0.841 | 5.51 | 979 | 54.7 | 34% |
| Ru30/Ta30/Ru100 | reference | 0.614 | 4.55 | 946 | 40.8 | Ref. |

As shown in row 6, the reference has a magnetic moment of 0.614 nanowebers. Compared with the reference MTJ, the MTJs comprised of the NiFeHf inner capping layer in rows 2 to 5 have an increase in Bs of over 10%. For example, the MTJ capped with 400 W/200 W NiFeHf has a Bs of 0.779 nw, an increase of 0.165 nw over the reference. Based on Bs=0.61 nw for a 500 Angstrom thick 400 W/200 W NiFeHf low magnetization layer, the moment contribution by a 25 Angstrom thick NiFeHf cap is 0.03 nw. Thus, there is a 0.165-0.03 or 0.162 nw discrepancy. The 0.165 nw is equivalent to an 8 to 9 Angstrom thick NiFe layer. This 8 to 9 Angstrom thick NiFe moment contribution most likely results from a substantial reduction of the "dead layer" as mentioned previously that results from diffusion of Ru into the NiFe free layer in the reference sample. Compared with a Bs=0.614 nw for a 33 Angstrom thick NiFe free layer capped with Ru/Ta/Ru, the Bs (0.591 nw) for a nonmagnetic NiFeHf (i.e. 300 W/300 W) capped MTJ is only slightly reduced. The Bs reduction could be caused by the over saturated Hf atoms being diffused to the underlying NiFe free layer. Thus, it is important to avoid a high Hf content of greater than about 25% in the NiFeHf layer in order to avoid Hf diffusion into the adjacent free layer. From this experiment, it may be fair to say that NiFeHf formed by 300 W/300 W co-sputtering is non-magnetic while the NiFeHf layers formed in rows 2 to 5 show a small amount of Bs in an annealed 500 Angstrom thick film and may be classified as having low magnetization.

Compared with the MTJ with the standard Ru/Ta/Ru capping layer that has a dR/R of 40.8%, the dR/R values for MTJs having a NiFeHf inner capping layer as disclosed herein is greater than 50% for the examples in rows 2 to 5. These results indicate that the low magnetization NiFeHf capping layer is responsible for the significant dR/R increase which is attributed to a substantial reduction of the "dead layer" between the free layer and capping layer. A dR/R=56.2% is achieved in row 4 which is a huge 38% improvement over the reference and is the highest dR/R value ever reported for an AlOx-MTJ with a permalloy free layer. Another important consideration is that while the RA of the reference MTJ is 950 $\Omega$-$\mu$m$^2$, the RA=748 $\Omega$-$\mu$m$^2$ for the 300 W/300 W co-sputtered cap (row 1) is considerably lower. A lower RA is also attributed to a NiFeHf capping layer which is capable of extracting oxygen atoms from the free layer to produce a more distinct boundary between the tunnel barrier and free layer. As mentioned previously, the oxygen gettering power of a NiFeHf inner capping layer is higher than other known materials because of its very high oxidation potential.

The advantages of the present invention are that a large improvement in dR/R and acceptable RA values for high speed MRAM devices and the like can be achieved by employing a MTJ capping layer comprised of a low magnetization NiFeHf inner layer. In particular, the NiFeHf functions as a powerful oxygen getter layer to remove oxygen from an underlying NiFe or CoFeB/NiFe free layer and thereby form a more distinct boundary between the tunnel barrier and the NiFe free layer. Moreover, the NiFeHf inner capping layer substantially reduces the size of the "dead layer" between the free layer and capping layer thereby enabling a higher dR/R to be realized. The lattice matching between free layer and capping layer is especially improved when the Fe content in the NiFeHf inner capping layer is essentially the same as in the adjacent NiFe free layer. Also, a NiFeHf capped free layer in an MTJ having an MgO tunnel barrier layer yields a negative Hin value that ensures a higher dR/R result than for MTJs with a positive Hin value which is typical of Ru capped free layers. Although the magnetostriction has not been measured, it is believed that the better lattice matching between a NiFe free layer and the NiFeHf inner capping layer will lead to a lower $\lambda$s than the standard MTJs having a Ru cap on the free layer. A co-sputtering of NiFe and Hf targets enables a NiFeHf layer to be formed with a variable Hf content so that the capping layer composition can be tuned to improve MTJ performance in either TMR or MRAM applications.

While this invention has been particularly shown and described with reference to, the preferred embodiment thereof, it will be understood by those skilled in the art that various changes in form and details may be made without departing from the spirit and scope of this invention.

We claim:

1. A method of forming an MTJ element on a substrate, comprising:
   (a) forming a free layer in an MTJ stack of layers; said free layer has a magnetic moment and a surface comprised of NiFe$_S$ alloy that contacts a low magnetization capping layer where s is the atomic % of Fe in the NiFe$_S$ alloy; and
   (b) forming the low magnetization capping layer on the surface of said NiFe$_S$ free layer wherein said low magnetization capping layer is a composite having an inner layer comprised of NiFeHf contacting the free layer and one or more metal layers formed on the NiFeHf layer, the low magnetization NiFeHf layer has a NiFe composition equivalent to that in the NiFe$_S$ alloy and a magnetic moment that is less than about 30% of the magnetic moment of the free layer.

2. The method of claim 1 wherein the substrate is a bottom conductor in an MRAM structure or a bottom shield in a TMR read head and the MTJ stack is further comprised of a seed layer, AFM layer, pinned layer, and tunnel barrier layer that are sequentially formed on the substrate, and said free layer is formed on the tunnel barrier layer.

3. The method of claim 2 wherein the tunnel barrier layer is made of AlOx, MgO, or AlTiOx.

4. The method of claim 2 wherein the free layer is comprised of a CoFeB layer and the tunnel barrier is made of MgO.

5. The method of claim 1 wherein all layers in the MTJ stack are laid down in a low pressure sputter deposition system having multiple chambers and step (b) is performed in a chamber capable of co-sputtering two targets.

6. The method of claim 5 wherein the NiFeHf layer is formed on a free layer comprised of NiFe by co-sputtering a NiFe target and a target made of Hf.

7. The method of claim 6 wherein a forward power of about 100 Watts (W) to 300 W is applied to the Hf target and a forward power of about 300 W to 600 W is applied to the NiFe target to deposit a NiFeHf layer.

8. The method of claim 6 wherein the Fe content in the NiFe target is essentially the same as in the NiFe free layer and is from about 8 atomic % to 21 atomic %, and the thickness of the NiFeHf layer is from about 10 Angstroms to 50 Angstroms.

9. The method of claim 1 wherein said low magnetization capping layer is further comprised of a Ta layer on the NiFeHf layer and a Ru layer on the Ta layer.

10. The method of claim 2 further comprised of annealing the MTJ stack after all layers are deposited with an applied magnetic field of about 10000 Oersted for 5 hours at a temperature from about 250° C. to 280° C. when the tunnel barrier layer is AlOx or at 300° C. to 350° C. when the tunnel barrier layer is MgO.

11. The method of claim 6 wherein a forward power applied to the Hf target is raised to increase the Hf content in the NiFeHf layer and thereby increase the oxygen gettering capability of said low magnetization capping layer.

12. The method of claim 8 wherein the thickness of the NiFeHf layer is modified to change dR/R, RA, and magnetostriction values for the MTJ element.

* * * * *